United States Patent

Chu et al.

[11] Patent Number: 5,986,332
[45] Date of Patent: Nov. 16, 1999

[54] INTEGRATED CIRCUIT LEADFRAME INCORPORATING OVERHANGING LEADS

[75] Inventors: Chin Seng Chu, Sunnyvale; Peter H. Spalding, Cupertino, both of Calif.

[73] Assignee: National Semiconductor Corporation, Santa Clara, Calif.

[21] Appl. No.: 09/132,883

[22] Filed: Aug. 12, 1998

[51] Int. Cl.[6] .................................................. H01L 23/495
[52] U.S. Cl. .......................... 257/666; 257/676; 257/675
[58] Field of Search ..................................... 257/666, 676, 257/675, 706, 707

[56] References Cited

U.S. PATENT DOCUMENTS

| | | |
|---|---|---|
| 5,206,794 | 4/1993 | Long . |
| 5,252,855 | 10/1993 | Ogawa et al. . |
| 5,675,182 | 10/1997 | Moscicki . |
| 5,703,396 | 12/1997 | Kurihara .................................. 257/666 |
| 5,821,628 | 10/1998 | Hotta . |

*Primary Examiner*—Sheila V. Clark
*Attorney, Agent, or Firm*—Beyer & Weaver, LLP

[57] ABSTRACT

A lead frame includes a die attach pad having a certain area with a portion of the area being adapted to receive and support an integrated circuit die. The lead frame also includes a plurality of leads for electrically connecting the integrated circuit die to other electrical elements external to the package. At least one of the leads is configured to have a portion of the lead overhang, but be spaced slightly apart from, the area of the die attach pad. The overhanging portions of the leads are positioned in close proximity to the die attach pad in order to improve the thermal transfer from the die attach pad to the leads during the operation of the integrated circuit package. A method of forming the lead frame includes the step of folding at least a portion of the lead frame which includes at least one of the leads such that the at least one lead is positioned with a portion of that lead overhanging, but being spaced slightly apart from, the die attach pad.

12 Claims, 4 Drawing Sheets

INTEGRATED CIRCUIT LEADFRAME INCORPORATING OVERHANGING LEADS

BACKGROUND OF THE INVENTION

The present invention relates generally to integrated circuit (IC) packages and more specifically to lead frames for use in an integrated circuit package and methods of forming the lead frame.

In the IC packaging industry, there is continuous pressure to reduce the cost of packaging ICs. To accomplish this, a wide variety of package designs and assembly methods have been developed. One of the major concerns when designing integrated circuit packages is dealing with the heat generated by the integrated circuit die during its operation. The amount of heat generated by the die varies dramatically depending on the specific die used in the package. Therefore, in order to minimize the cost of producing a given integrated circuit package, the heat dissipating characteristics of the integrated circuit package should be designed to be sufficient to deal with the heat generated by the die of the package without adding any unnecessary cost to producing the package.

In a conventional IC package, the majority of the heat generated by the die is dissipated through the leads of the package. This is because the leads provide the best thermal path away from the die and the die attach pad on which the die is typically supported. Currently, in a situation in which the die generates more heat than can be properly dissipated through the leads of a conventional integrated circuit package, a heat slug or other such heat dissipating device is included in the package to improve the heat dissipating characteristics of the package. The die typically attached directly to the heat slug and one surface of the heat slug is left exposed when the package is encapsulated thereby providing a direct thermal path from the die out of the package. In an example, a package including a heat slug may have a thermal dissipating capacity one hundred times that of a conventional package without a heat slug. Although this approach substantially improves the heat dissipating characteristics of the package, it also increases the cost of the package. In many cases, this approach of adding a heat slug provides much more heat dissipating capability than is necessary and therefore unnecessarily increases the cost of the package. For this reason, it is desirable to provide a package that improves the heat dissipating characteristics of the package without adding all of the costs associated with providing a heat slug.

FIG. 1 illustrates one prior art approach to improving the heat dissipating characteristics of a package without adding a heat slug. This approach is referred to as the thermal coastline approach. In the thermal coastline approach, the die is supported on a die attach pad of a lead frame. The die attach pad and the leads are configured to increase the area of the ends of the leads which face the die attach pad in order to increase the thermal transfer from the die attach pad to the leads.

FIG. 1 is a partial diagrammatic plan view of a lead frame 10 using the thermal coastline approach. Lead frame 10 includes a die attach pad 12 and a plurality of leads 14 for electrically connecting a die (not shown) to other external elements. As illustrated in FIG. 1, leads 14 and die attach pad 12 are formed such that their edges, indicated by edges 16 and 18 respectively, face one another along a line that is at an angle A relative to the symmetrical axes of the lead frame indicated by center lines 20 and 22. When comparing this configuration to a conventional configuration, this angling of the edge surfaces of die attach pad 12 and the facing leads 14 increases the surface area of each of the edges 16 of the leads 14 that face edge 18 of die attach pad 12.

Since the amount of the surface area of the leads facing the die attach pad significantly impacts the heat dissipating characteristics of the lead frame, the above described configuration improves the heat dissipating characteristics of a package using this type of lead frame. However, this approach is limited by the amount that the surface area of the facing edges may be increased without creating other problems such as increasing the size of the package. Generally, the thermal coastline approach may provide an improvement of up to about 20 percent in the heat dissipating characteristics of a given package compared to a conventionally configured package that uses a lead frame with a square edged die attach pad and leads.

Accordingly, it is desirable to provide a package configuration having even greater thermal dissipating characteristics than the above described thermal coastline approach without requiring the use of a heat slug or any other such additional heat dissipating device. The present invention provides arrangements and methods of producing lead frames and integrated circuit packages which are capable of substantially improved heat dissipating characteristics compared with conventional packages that do not include a heat slug or any other additional heat dissipating device. The present invention accomplishes these improved heat dissipation characteristics without requiring the use of a heat slug or any other additional heat dissipating device.

SUMMARY OF THE INVENTION

As will be described in more detail hereinafter, a lead frame for use in an integrated circuit package which does not include a heat slug or other such heat dissipating device is herein disclosed. The lead frame includes a die attach pad having a certain area with a portion of the area being adapted to receive and support an integrated circuit die. The lead frame also includes a plurality of leads for electrically connecting the integrated circuit die to other electrical elements external to the package. At least one of the leads is configured to have a portion of the lead overhang, but spaced slightly apart from, the area of the die attach pad. The overhanging portions of the leads are positioned in close proximity to the die attach pad in order to improve the thermal transfer from the die attach pad to the leads during the operation of the integrated circuit package.

In one embodiment, all of the plurality of leads are configured such that a portion of each of the leads overhangs the die attach pad. In another embodiment, the lead frame has a certain thickness and the space between the die attach pad and the portions of the leads that overhang the die attach pad is less than or equal to about the thickness of the lead frame. In still another embodiment, the lead frame has a certain thickness, the leads have a certain width, and the portions of the leads that overhang the die attach pad are configured such that the overhanging leads overhang the die attach pad by a distance greater than or equal to about the width of the leads.

A method of forming a lead frame for use in an integrated circuit package is also herein disclosed. The method includes the steps of forming a lead frame from a sheet of material with the lead frame including a die attach pad and a plurality of leads for electrically connecting the die to other elements external to the package. The die attach pad has a certain area with a portion of the area being adapted to supporting an integrated circuit die. The method further includes the step of folding at least a portion of the lead frame which includes at least one of the leads such that the at least one lead is positioned with a portion of that lead overhanging, but being spaced slightly apart from, the die attach pad. The overhanging portions of the leads are positioned in close proximity to the die attach pad in order to improve the thermal transfer from the die attach pad to the leads during the operation of the integrated circuit package.

In a first embodiment of the method, the step of folding the lead frame includes the step of folding a portion of the lead frame including all of the plurality of leads such that a portion of each of the leads overhangs, but is spaced slightly apart from, the die attach pad. In a second embodiment of the method, the lead frame has a certain thickness and the step of folding the lead frame includes the step of folding the lead frame such that the space between the die attach pad and the portions of the leads that overhang the die attach pad is less than or equal to about the thickness of the lead frame. In a third embodiment of the method, the lead frame has a certain thickness, the leads have a certain width, and the step of folding the lead frame includes the step of folding the lead frame such that the portions of the leads that overhang the die attach pad overhang the die attach pad by a distance greater than or equal to about the width of the leads.

In another embodiment of the method, the method further includes the step of recessing the die attach pad a certain distance relative to the leads. In one version of this embodiment, the step of recessing the die attach pad includes the step of recessing the die attach pad such that when the lead frame is folded, the portions of the leads that overhang the die attach pad are spaced apart from the die attach pad by a distance of about the distance that the die attach pad has been recessed.

BRIEF DESCRIPTION OF THE DRAWINGS

The features of the present invention may best be understood by reference to the following description of the presently preferred embodiments together with the accompanying drawings.

DETAILED DESCRIPTION OF THE PREFERRED EMBODIMENTS

An invention is herein described for providing lead frames for use in an integrated circuit package which does not include a heat slug or other such heat dissipating device and methods of forming the lead frame. In the following description, numerous specific details are set forth for specific embodiments in order to provide a thorough understanding of the present invention. However, in view of this description, it will be obvious to one skilled in the art that the present invention may be embodied in a wide variety of specific configurations. Also, well known integrated circuit package manufacturing processes such as lead frame etching or stamping, wire bonding processes, integrated circuit package encapsulating or molding processes, and other such conventional integrated circuit manufacturing processes will not be described in detail in order not to unnecessarily obscure the present invention.

Figure 1:
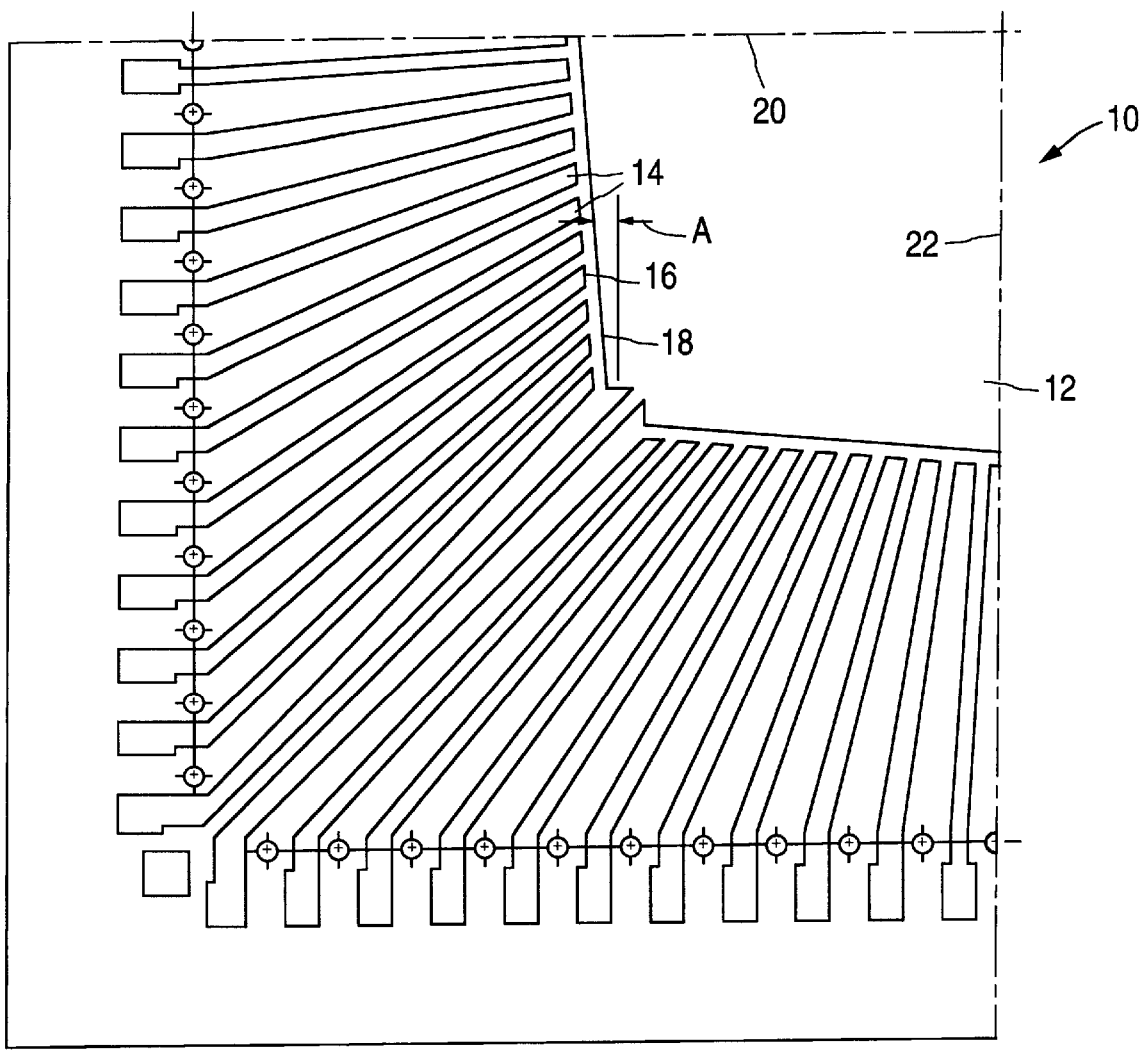
FIG. 1 is a partial diagrammatic cross sectional view of a prior art integrated circuit package lead frame.
Figure 2:
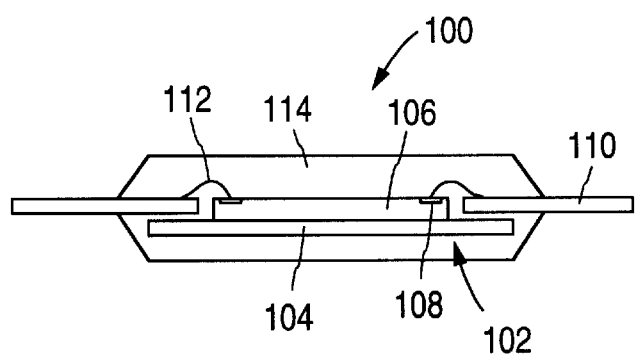
FIG. 2 is a diagrammatic cross sectional view of one embodiment of an integrated circuit package in accordance with the invention.

Referring initially to FIG. 2, an integrated circuit package 100 in accordance with the invention will initially be described. Package 100 includes a lead frame 102 having a die attach pad 104 configured to support a conventional integrated circuit die 106. Die 106 typically includes a plurality of input/output terminal pads 108 located on its top surface. Lead frame 102 also includes a plurality of leads 110 for electrically connecting input/output terminal pads 108 on die 106 to other electrical elements external to package 100. In the embodiment shown, input/output terminal pads 108 are electrically connected to leads 110 using a plurality of bonding wires 112. Also, lead frame 102, die 106, bonding wires 112, and portions of leads 110 are all encapsulated by a conventional encapsulating material 114.

As shown in FIG. 2, and in accordance with the invention, portions of leads 110 are specifically configured to overhang portions of, but be spaced slightly apart from, die attach pad 104. This specific configuration positions the overhanging portions of leads 110 in close proximity to die attach pad 104. This configuration also allows the surface area of each of the leads which directly faces the surface of the die attach pad to be substantially increased compared to the conventional configuration in which the edges of the ends of the leads face the edge of the die attach pad as described above in the background. Since the amount of the surface area of the leads facing the die attach pad significantly impacts the heat dissipating characteristics of the lead frame, the specific configuration of the invention substantially improves the heat dissipating characteristics of a package using this type of lead frame compared to prior art lead frame configurations.

In the embodiment illustrated in FIG. 2, lead frame 102, which includes die attach pad 104 and leads 110, is made from a material having a certain thickness. Also, the portions of the leads 110 which overhang die attach pad 104 have a certain width. In this embodiment, leads 110 are positioned such that leads 110 overhang die attach pad 104 by a distance greater than or equal to about the width of the leads. Because leads 110 are typically wider than they are thick, this specific configuration causes the area of each lead 110 that directly faces die attach pad 104 to be substantially greater than what is possible using a conventional lead frame in which the edges of the ends of the leads face the edge of the die attach pad.

Also, in this embodiment, the portions of leads 110 that overhang die attach pad 104 are positioned such that the space between the portions of the leads that overhang the die attach pad and the die attach pad is less than or equal to about the thickness of the lead frame. Because encapsulating material 114 is typically not a very good thermal conductor, this minimizing of the space between the die attach pad and the leads also helps to improve the heat dissipating characteristics of the package by reducing the amount of encapsulating material between the die attach pad and the portions of the leads directly facing the die attach pad.

Lead frame 102 may be made using any conventional process for making a lead frame such as, but not limited to, etching processes and stamping processes. Also, the lead frame of the invention may be formed into its specific configuration using any desired method so long as at least a portion of the leads end up overhanging the die attach pad. For example, as will be described in more detail hereinafter, the lead frame may be formed as a single piece which is folded such that portions of the leads overhang the die attach pad. Alternatively, the lead frame may be formed from two separate pieces with the die attach pad being one piece and the leads being a second piece which is positioned in the proper orientation relative to the die attach pad during the assembly of the package.

Now that the basic elements of an integrated circuit package in accordance with the invention have been described, one preferred method of producing lead frame 102 in accordance with the invention will be described in detail with reference to FIGS. 3–6. In this embodiment, lead frame 102 is formed from a single sheet of lead frame material 116. In accordance with the invention, portions of the lead frame are folded in order to cause portions of leads 110 to overhang die attach pad 104.

Figure 3:
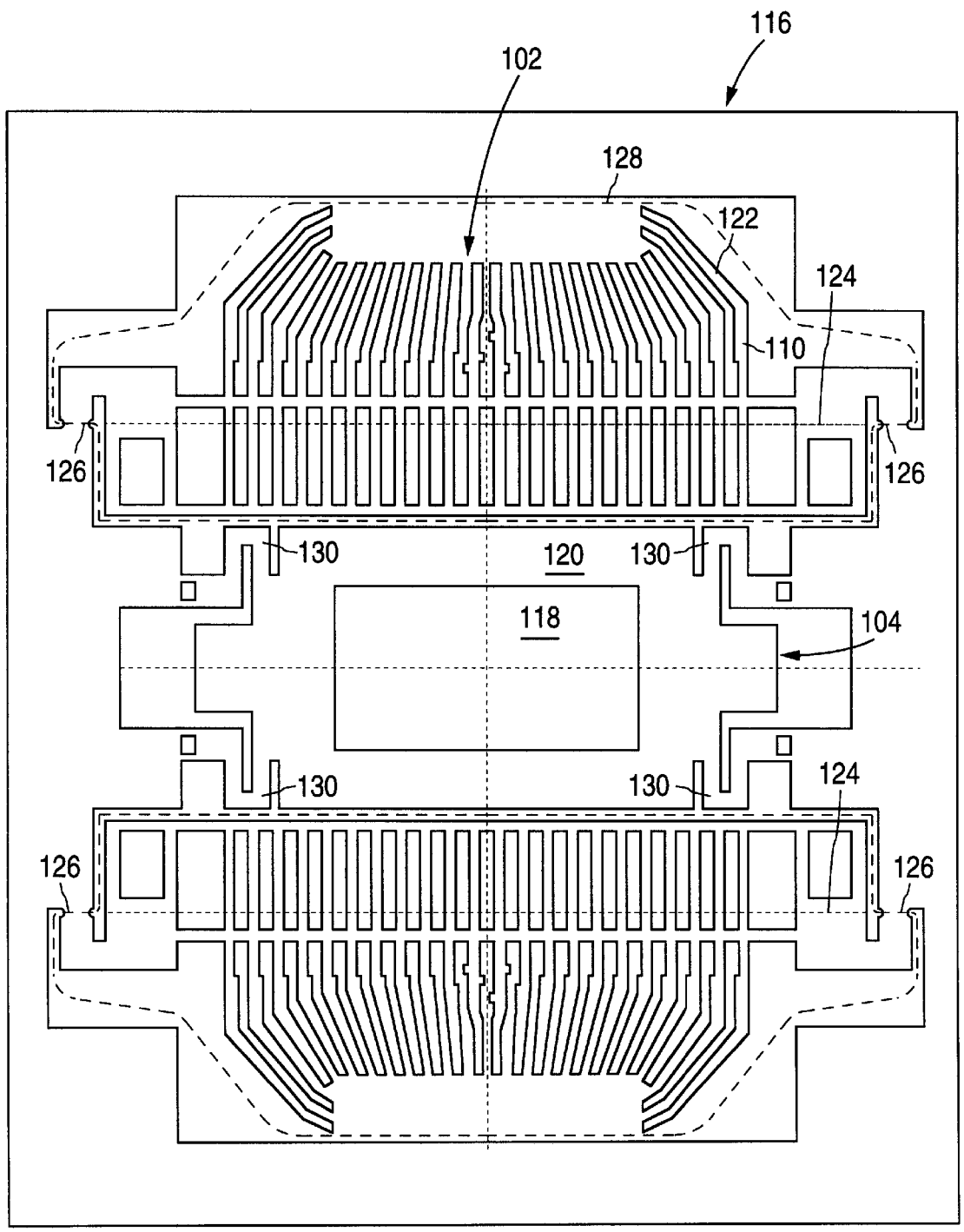
FIG. 3 is a diagrammatic plan view of one embodiment of a lead frame designed in accordance with the invention.

As illustrated in FIG. 3, lead frame 102 is etched or stamped from lead frame material 116 which has a certain thickness. As described above, lead frame 102 includes a die attach pad 104 and a plurality of leads 110. In this example, die attach pad 104 has a die supporting portion 118 adapted for supporting integrated circuit die 106 as shown in FIG. 2. Die attach pad 104 also has a peripheral portion 120 surrounding die supporting portion 118. Furthermore, in this example, each of leads 110 includes an end portion 122 which will end up overhanging peripheral portion 120 of die attach pad 104 once the lead frame has been folded.

Figure 4:
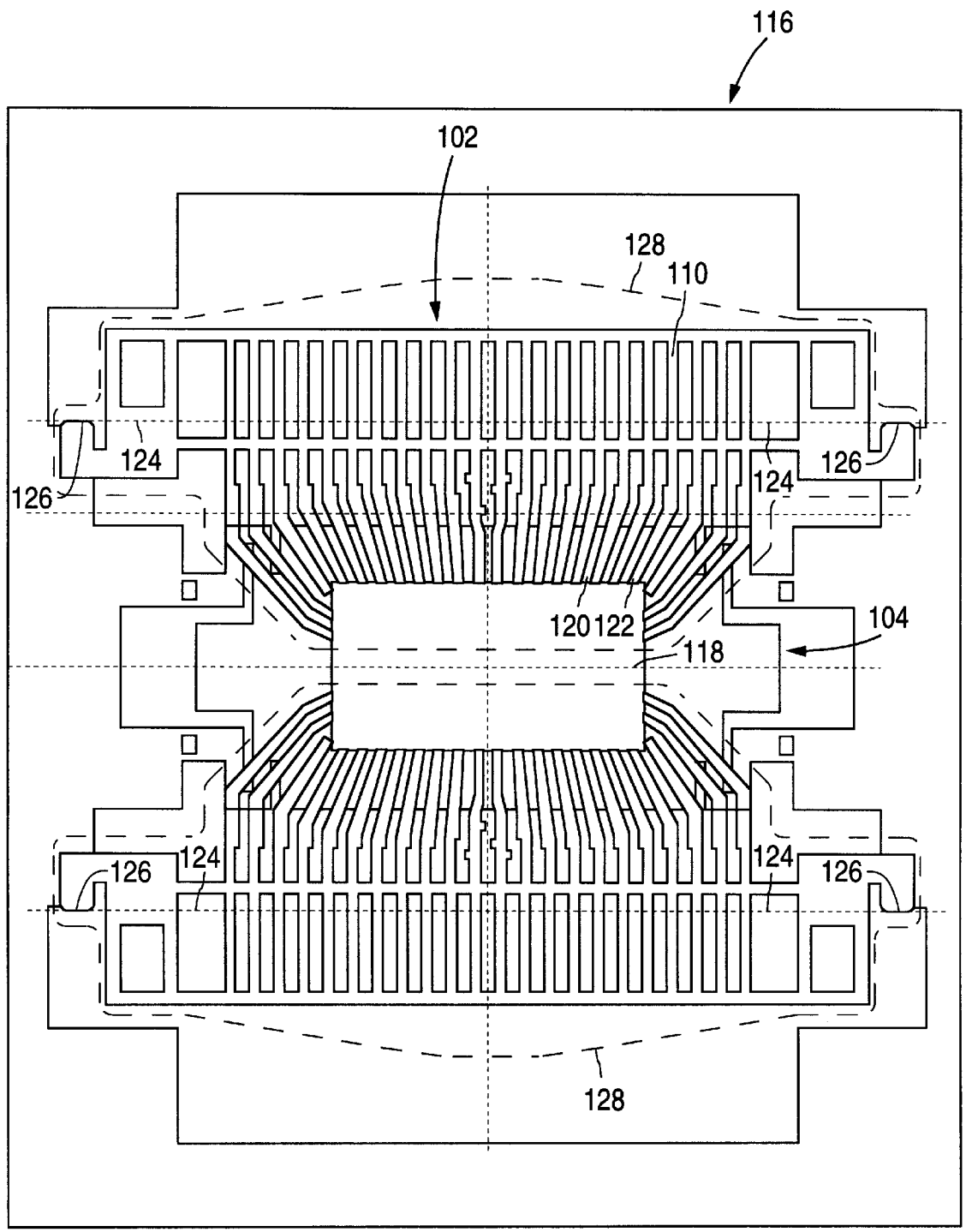
FIG. 4 is a diagrammatic plan view of the lead frame of FIG. 3 after a portion of the lead frame has been folded in accordance with one embodiment the invention.
Figure 5:
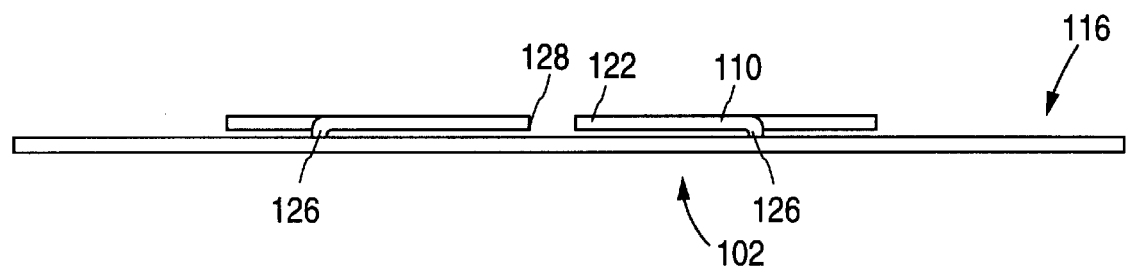
FIG. 5 is a diagrammatic cross sectional view of one version of the lead frame of FIG. 3.

As illustrated in FIGS. 3–5. once lead frame 102 has been etched or stamped from lead frame material 116, a portion of the lead frame including leads 110 is folded such that end portions 122 of leads 110 overhang peripheral portions 120 of die attach pad 104. In this case, lead frame 102 is folded along folding lines 124 at folding points 126. As shown in FIG. 3, lead frame 102 is formed such that all of leads 110 on each side of die attach pad 104, indicated by the portions of lead frame 102 encircled by dashed lines 128, may be pivoted about folding points 126. As lead frame 102 is folded, end portions 122 of leads 110 pivot from their initial positions near the outer edge of lead frame material 116 as shown in FIG. 3 to a folded position in which end portions 122 of leads 110 overhang peripheral portion 120 of die attach pad 104 as shown in FIG. 4. FIG. 5 illustrates a cross sectional view of lead frame 102 after it has been folded as shown in FIG. 4.

As mentioned above, it is desirable to control the spacing between the end portions 122 of leads 110 and the peripheral potions of die attach pad 104 which the end portions 122 of the leads overhang. This spacing is indicated by reference numeral 128 in FIG. 5. In the embodiment shown in FIG. 5, this spacing is controlled by the radius of the folds at folding points 126. If a larger radius is used to fold the lead frame, spacing 128 is larger and if a smaller radius is used, spacing 128 is smaller.

Figure 6:
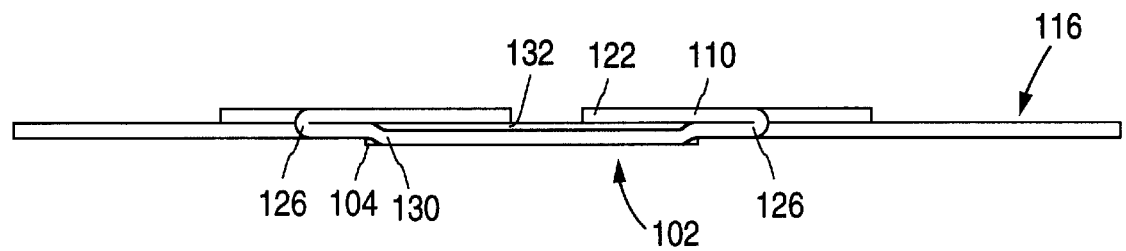
FIG. 6 is a diagrammatic cross sectional view of another version of the lead frame of FIG. 3 in which a die attach pad of the lead frame has been recessed.

FIG. 6 illustrates an alternate method to controlling the spacing between end portions 122 of leads 110 and the peripheral portion of die attach pad 104. In this version of the embodiment, die attach pad 104 is recessed relative to the rest of the lead frame before the lead frame is folded. In this case, die attach pad 104 is recessed by pressing die attach pad 104 down relative to the rest of the lead frame. This causes lead frame 102 to bend at bending areas 130 best shown in FIGS. 3 and 6. Because die attach pad 104 is isolated from the rest of the lead frame by bending areas 130, the die attach pad portion of the lead frame may be easily recessed by pressing down die attach pad 104 and deforming bending areas 130.

With die attach pad 104 recessed, the lead portion 128 of the lead frame may be folded as described above. However, since die attach pad 104 is recessed, the lead portion 128 may be folded such that the bottom surface of the folded portion ends up flush with the top surface of the unfolded portion as indicated in FIG. 6. In other words, the bending radius at folding points 126 may be essentially zero. With this configuration, the spacing between end portions 122 of leads 110 and the peripheral portion of die attach pad 104 is controlled by the distance by which the die attach pad has been recessed. This spacing is indicated by reference numeral 132 in FIG. 6.

Once lead frame 102 has been folded, the integrated circuit package may be assembled using conventional assembly techniques. As illustrated by the finished integrated circuit package of FIG. 2, the assembly of the integrated circuit package would typically include attaching a die to the lead frame, wire bonding the input/output terminals of the die to their associated leads, encapsulating the die, bonding wires, and the appropriate portions of the lead frame, and trimming off the excess portions of the lead frame.

Although only one specific method of providing a lead frame in accordance with the invention has been described in detail, it should be understood that the lead frame may be produced in a wide variety of manners and still remain within the scope of the invention. For example, although the lead frame has been described as being folded in order to cause the leads to overhang the die attach pad, it should be understood that this is only one possible method for achieving the configuration of the invention. Also, although only a few specific embodiments of lead frames in accordance with the invention have been described above in detail, it is to be understood that the lead frames of the present invention may be embodied in a wide variety of alternative forms and still remain within the scope of the invention. Any of these various embodiments would equally fall within the scope of the invention so long as at least a portion of at least one of the leads of the leadframe overhangs the die attach pad in order to improve the thermal transfer from the die attach pad to the leads.

Although only certain conventional integrated circuit package components have been described as being used with the novel lead frame configuration in order to provide an integrated circuit package in accordance with the invention, it should be understood that the present invention may take on a wide variety of specific configurations using a variety of other conventional components and still remain within the scope of the present invention so long as at least a portion of at least one of the leads of the leadframe overhangs the die attach pad in order to improve the thermal transfer from the die attach pad to the leads. Therefore, the present examples are to be considered as illustrative and not restrictive, and the invention is not to be limited to the details given herein, but may be modified within the scope of the appended claims.

What is claimed is:

1. An integrated circuit package comprising:
   an integrated circuit die; and
   a lead frame including a die attach pad and a plurality of leads for electrically connecting the die to other elements external to the package, the die attach pad having a certain area with a portion of the area supporting the die, at least one of the leads being positioned within the package such that a portion of the lead overhangs, but is spaced slightly apart from and is not adhered to the die attach pad, wherein the overhanging portion of the overhanging lead overlaps the die attach pad by a distance greater than the thickness of the lead and is positioned in close proximity to the die attach pad thereby improving the thermal transfer from the die attach pad to the overhanging lead.

2. An integrated circuit package according to claim 1 wherein the integrated circuit package does not include a heat slug, heat sink, or any other separate heat dissipating element.

3. An integrated circuit package according to claim 1 wherein all of the plurality of leads are positioned within the package such that a portion of each of the leads overhangs the die attach pad.

4. An integrated circuit package according to claim 1 wherein the lead frame has a certain thickness and wherein the space between the die attach pad and the portions of the leads that overhang the die attach pad is less than or equal to about the thickness of the lead frame.

5. An integrated circuit package comprising:

an integrated circuit die; and a lead frame including a die attach pad and a plurality of leads for electrically connecting the die to other elements external to the package, the die attach pad having a certain area with a portion of the area supporting the die, at least one of the leads being positioned within the package such that a portion of the die lead overhangs, but is spaced slightly apart from, the die attach pad; and wherein the lead frame has a certain thickness, wherein the leads have a certain width, and wherein the portions of the leads that overhang the die attach pad are positioned such that the overhanging leads overhang the die attach pad by a distance greater than or equal to about the width of the leads.

6. A lead frame for use in an integrated circuit package, the lead frame comprising:

a) a die attach pad having a certain area with a portion of the area being adapted to receive and support an integrated circuit die; and b) a plurality of leads for electrically connecting the integrated circuit die to other electrical elements external to the package, at least one of the leads being configured to have a portion of the lead overhang, but be spaced slightly apart from and not adhered to, the die attach pad, wherein the overhanging portion of the overhanging lead overhangs the die attach pad by a distance greater than the thickness of the lead and is positioned in close proximity to the die attach pad thereby improving the thermal transfer from the die attach pad to the overhanging lead.

7. A lead frame for use in an integrated circuit package, the lead frame comprising:

a die attach pad having a certain area with a portion of the area being adapted to receive and support an integrated circuit die; and a plurality of leads for electrically connecting the integrated circuit die to other electrical elements external to the package, at least one of the leads being configured to have a portion of the lead overhang, but be spaced slightly apart from, the area of the die attach pad; and wherein the lead frame has a certain thickness, wherein the leads have a certain width, and wherein the portions of the leads that overhang the die attach pad are configured such that the overhanging leads overhang the die attach pad by a distance greater than or equal to about the width of the leads.

8. A lead frame according to claim 6 wherein all of the plurality of leads are configured such that a portion of each of the leads overhangs the die attach pad.

9. A lead frame for use in an integrated circuit package, the lead frame comprising:

a die attach pad having a certain area with a portion of the area being adapted to receive and support an integrated circuit die; and a plurality of leads for electrically connected the integrated circuit die to other electrical elements external in the package, at least one of the leads being configured to have a portion of the lead overhang, but be spaced slightly apart from, the area of the die attach pad; and wherein the lead frame has a certain thickness and wherein the space between the die attach pad and the portions of the leads that overhang the die attach pad is less than or equal to about the thickness of the lead frame.

10. An integrated circuit package comprising:

an integrated circuit die; and a lead frame including a die attach pad that supports the die and a plurality of leads for electrically connecting the die to other elements external to the package, wherein a portion of the lead frame is folded back upon itself thereby pivoting the leads about a fold line to position at least a selected plurality of the leads within the package such that a portion of the selected leads overhang, but are spaced slightly apart from the die attach pad thereby improving the thermal transfer from the die attach pad to the overhanging leads.

11. An integrated circuit package according to claim 10 wherein all of the plurality of leads are positioned within the package such that a portion of each of the leads overhangs the die attach pad.

12. An integrated circuit package as recited in claim 10 wherein the portions of the leads that overhang the die attach pad are configured such that the overhanging leads overhang the die attach pad by a distance that is at least a great as about the width of the leads.

* * * * *

UNITED STATES PATENT AND TRADEMARK OFFICE
CERTIFICATE OF CORRECTION

PATENT NO. : 5,986,332
DATED : November 16, 1999
INVENTOR(S) : Chin Seng Chu and Peter H. Spalding It is certified that error appears in the above-identified patent and that said Letters Patent are hereby corrected as shown below:

In Claim 1, Line 11, (Column 7, Line 5), replace "overlaps" with --overhangs--.

In Claim 5, Line 8, (Column 7, Line 30), after "the" delete "die".

In Claim 9, Line 7, (Column 8, line 24), after "external" replace "in" with --to--.

Signed and Sealed this

Seventeenth Day of April, 2001

*Attest:*

NICHOLAS P. GODICI

*Attesting Officer*       *Acting Director of the United States Patent and Trademark Office*